US012041763B2

(12) United States Patent
Shao et al.

(10) Patent No.: US 12,041,763 B2
(45) Date of Patent: Jul. 16, 2024

(54) METHOD FOR FORMING CAPACITOR, CAPACITOR AND SEMICONDUCTOR DEVICE

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Guangsu Shao, Hefei (CN); Mengkang Yu, Hefei (CN); Xingsong Su, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 215 days.

(21) Appl. No.: 17/848,895

(22) Filed: Jun. 24, 2022

(65) Prior Publication Data
US 2023/0063571 A1 Mar. 2, 2023

Related U.S. Application Data

(63) Continuation of application No. PCT/CN2022/077651, filed on Feb. 24, 2022.

(30) Foreign Application Priority Data
Aug. 30, 2021 (CN) .......................... 202111007233.0

(51) Int. Cl.
*H01L 27/108* (2006.01)
*H10B 12/00* (2023.01)

(52) U.S. Cl.
CPC ........... *H10B 12/033* (2023.02); *H10B 12/31* (2023.02)

(58) Field of Classification Search
CPC ........ H10B 12/033; H10B 12/31; H01L 28/90
See application file for complete search history.

(56) References Cited

U.S. PATENT DOCUMENTS

| 6,369,432 B1 * | 4/2002 | Jost | ...................... H10B 12/033 257/E21.267 |
| 8,134,823 B2 | 3/2012 | Chen | |

(Continued)

FOREIGN PATENT DOCUMENTS

| CN | 107093604 A | 8/2017 |
| CN | 112786537 A | 5/2021 |

(Continued)

*Primary Examiner* — Mohammed R Alam
(74) *Attorney, Agent, or Firm* — Kilpatrick Townsend & Stockton LLP

(57) ABSTRACT

A method for forming a capacitor, the capacitor and a semiconductor device are provided. The method includes: providing a semiconductor structure including a substrate, a stacked-layer structure, a protective layer, a first mask layer, and a photolithography layer which is provided with a plurality of cross-shaped patterns arranged in a square close-packed manner; patterning the first mask layer based on the photolithography layer; forming a plurality of through holes penetrating through the protective layer and the stacked-layer structure based on the patterned first mask layer by etching, in which in a direction perpendicular to a surface of the substrate, a projection of each through hole is cross-shaped, and the plurality of through holes are arranged in the square close-packed manner; and forming a first electrode layer, a dielectric layer and a second electrode layer covering an inner wall of each through hole to form the capacitor.

16 Claims, 22 Drawing Sheets

(56) References Cited

U.S. PATENT DOCUMENTS

| | | | |
|---|---|---|---|
| 2009/0257169 A1 | 10/2009 | Chen | |
| 2011/0159660 A1* | 6/2011 | Kang | H10B 12/318 |
| | | | 216/17 |
| 2014/0092524 A1* | 4/2014 | Kim | H01G 4/008 |
| | | | 156/154 |
| 2018/0158829 A1 | 6/2018 | Song et al. | |

FOREIGN PATENT DOCUMENTS

| | | |
|---|---|---|
| CN | 112951768 A | 6/2021 |
| EP | 0788164 A1 | 8/1997 |
| JP | 2005260090 A | 9/2005 |
| TW | 200943493 A | 10/2009 |

\* cited by examiner

METHOD FOR FORMING CAPACITOR, CAPACITOR AND SEMICONDUCTOR DEVICE

CROSS-REFERENCE TO RELATED APPLICATIONS

The present application is a U.S. continuation application of International Application No. PCT/CN2022/077651, filed on Feb. 24, 2022, which claims priority to Chinese Patent Application No. 202111007233.0, filed on Aug. 30, 2021. International Application No. PCT/CN2022/077651 and Chinese Patent Application No. 202111007233.0 are incorporated herein by reference in their entireties.

BACKGROUND

A dynamic random access memory (DRAM) is a semiconductor memory device commonly used in computers, and consists of many repeated memory cells. Each memory cell includes a transistor and a capacitor. A gate of the transistor is connected to a word line, a drain is connected to a bit line, and a source is connected to the capacitor. A voltage signal of the word line can control the transistor to turn on or off, and then the data information stored in the capacitor may be read with the bit line, or data information may be written into the capacitor for storage with the bit line.

As the size of a DRAM device is becoming smaller, the requirements of the capacitor area and capacitance of a capacitor are increasing. Therefore, how to provide a capacitor structure with higher density capacitance is an urgent problem to be solved.

SUMMARY

The disclosure relates to the technical field of semiconductor technologies, and relates to but is not limited to a method for forming a capacitor, the capacitor and a semiconductor device.

In a first aspect, an embodiment of the disclosure provides a method for forming a capacitor. The method includes:
providing a semiconductor structure; in which the semiconductor structure includes a substrate, a stacked-layer structure, a protective layer, a first mask layer and a photolithography layer which are stacked in sequence; and in which the photolithography layer is provided with a plurality of cross patterns, and the cross patterns are arranged in a square close-packed manner;
patterning the first mask layer based on the photolithography layer until the protective layer is exposed;
forming a plurality of through holes penetrating through the protective layer and the stacked-layer structure by etching based on the patterned first mask layer to expose the substrate; in which in a direction perpendicular to a surface of the substrate, a projection of each through hole is cross-shaped, and the plurality of through holes are arranged in the square close-packed manner; and
forming a first electrode layer, a dielectric layer and a second electrode layer covering an inner wall of each through hole in sequence to form the capacitor.

In a second aspect, an embodiment of the disclosure provides a capacitor. The capacitor includes:
a substrate;
a first supporting layer, a second supporting layer and a third supporting layer arranged on the substrate, in which the second supporting layer is located between the first supporting layer and the third supporting layer;
a first electrode layer arranged perpendicular to the substrate and penetrating through the first supporting layer, the second supporting layer and the third supporting layer, in which in a direction perpendicular to a surface of the substrate, a projection of the first electrode layer is cross-shaped, and a plurality of first electrode layers are arranged in a square close-packed manner;
a dielectric layer covering a surface of each first electrode layer; and
a second electrode layer covering a surface of each dielectric layer.

In a third aspect, an embodiment of the disclosure provides a semiconductor device, and the semiconductor device includes at least one of the above capacitors.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The various embodiments discussed herein are generally shown in the accompanying drawings by way of example, but not limitation.

DETAILED DESCRIPTION

Figure 1A:
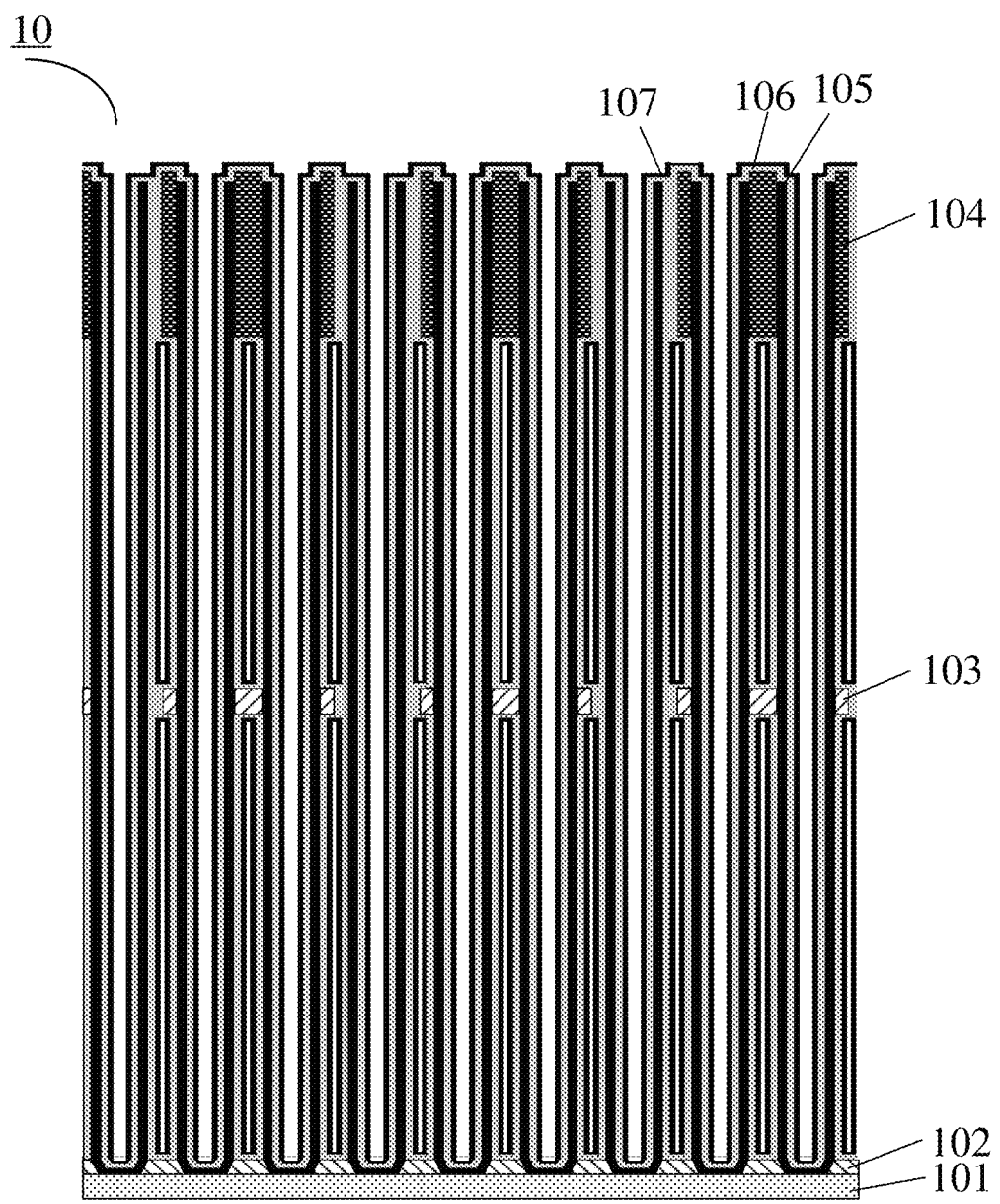
FIG. 1A is a partial structural schematic diagram of a capacitor provided by an embodiment of the disclosure.

Specific technical solutions of the disclosure will be further described in detail below with reference to the drawings in embodiments of the disclosure. The following embodiments are used to illustrate the disclosure, but not to limit the scope of the disclosure.

In the following description, numerous specific details are set forth in order to provide a more thorough understanding of the disclosure. However, it is apparent to those skilled in the art that the disclosure may be implemented without one or more of these details. In other embodiments, in order to avoid confusion with the disclosure, some technical features known in the art are not described. That is, not all features of actual embodiments are described herein, and well-known functions and constructions are not described in detail.

In the drawings, the dimensions of a layer, a region, an element or their relative dimensions may be magnified for clarity. The same reference numeral indicates the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In the related art, capacitor holes of capacitors are all circular in cross section, and the traditional arrangement of the capacitor holes is $6F^2$ DRAM capacitor honeycomb close packing, which leads to a small capacitance, a low capacitance density and thus poor properties of a capacitor in the related art.

Figure 1B:
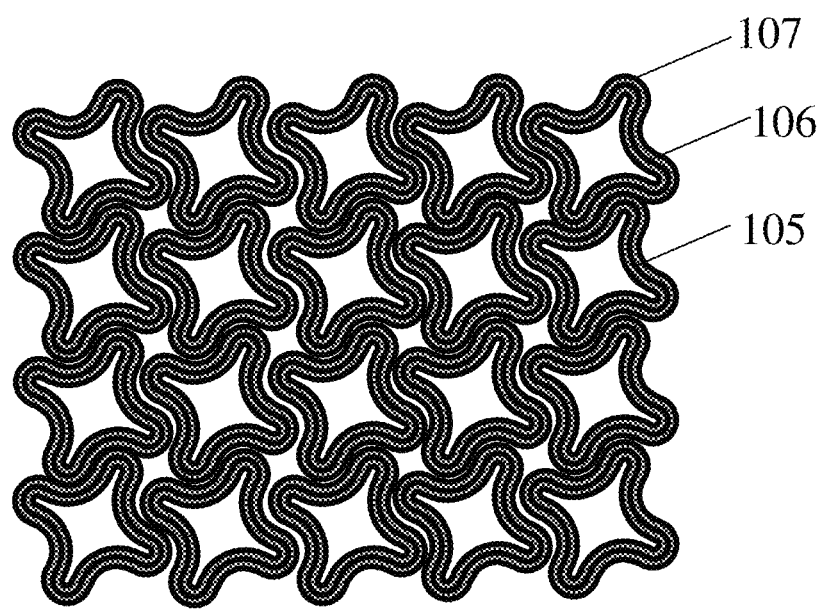
FIG. 1B is a cross-sectional schematic diagram of a capacitor provided by an embodiment of the disclosure.

Based on the problems existing in the related art, an embodiment of the disclosure provides a capacitor. Reference may be made to FIGS. 1A and 1B. FIG. 1A is a partial structural schematic diagram of the capacitor provided by the embodiment of the disclosure, and FIG. 1B is a cross-sectional schematic diagram of the capacitor provided by the embodiment of the disclosure. As shown in FIG. 1A, the capacitor 10 includes a substrate 101, a first supporting layer 102, a second supporting layer 103, a third supporting layer 104, a first electrode layer 105, a dielectric layer 106 and a second electrode layer 107.

The first supporting layer 102, the second supporting layer 103 and the third supporting layer 104 are arranged on the substrate 101, in which the second supporting layer 103 is located between the first supporting layer 102 and the third supporting layer 104.

The first electrode layer 105 is arranged perpendicular to the substrate 101 and penetrating through the first supporting layer 102, the second supporting layer 103 and the third supporting layer 104. In a direction perpendicular to a surface of the substrate 101, a projection of the first electrode layer 105 is cross-shaped, and a plurality of first electrode layers 105 are arranged in a square close-packed manner.

The dielectric layer 106 covers a surface of each first electrode layer 105.

The second electrode layer 107 covers a surface of each dielectric layer 106.

The embodiment of the disclosure provides the electrode layers arranged in the square close-packed manner, and the electrode layer has a cross-shaped structure. In this way, the utilization rate of the capacitor is increased, while the capacitor area and capacitance of a capacitor are increased, so that the capacitance density of the capacitor is higher, and the properties of the capacitor are improved.

The electrode layers of cross-shaped structures arranged in the square close-packed manner provided by the embodiment of the disclosure can be used for a vertical gate-all-around array (VGAA Array). That is, a capacitor may be directly connected to a transistor, and there is no need to connect the capacitor in a staggered way by a storage node contact (NC). The problem that a storage node contact of a $6F^2$ DRAM occupies the area of plane of the DRAM is solved, thereby enabling the size of a DRAM to be smaller.

In some embodiments, the capacitor provided by the embodiment of the disclosure is not only suitable for a double-layer capacitor, but also suitable for a single-layer capacitor. A method for forming a capacitor provided by an embodiment of the disclosure is illustrated below by taking the double-layer capacitor as an example.

Figure 2:
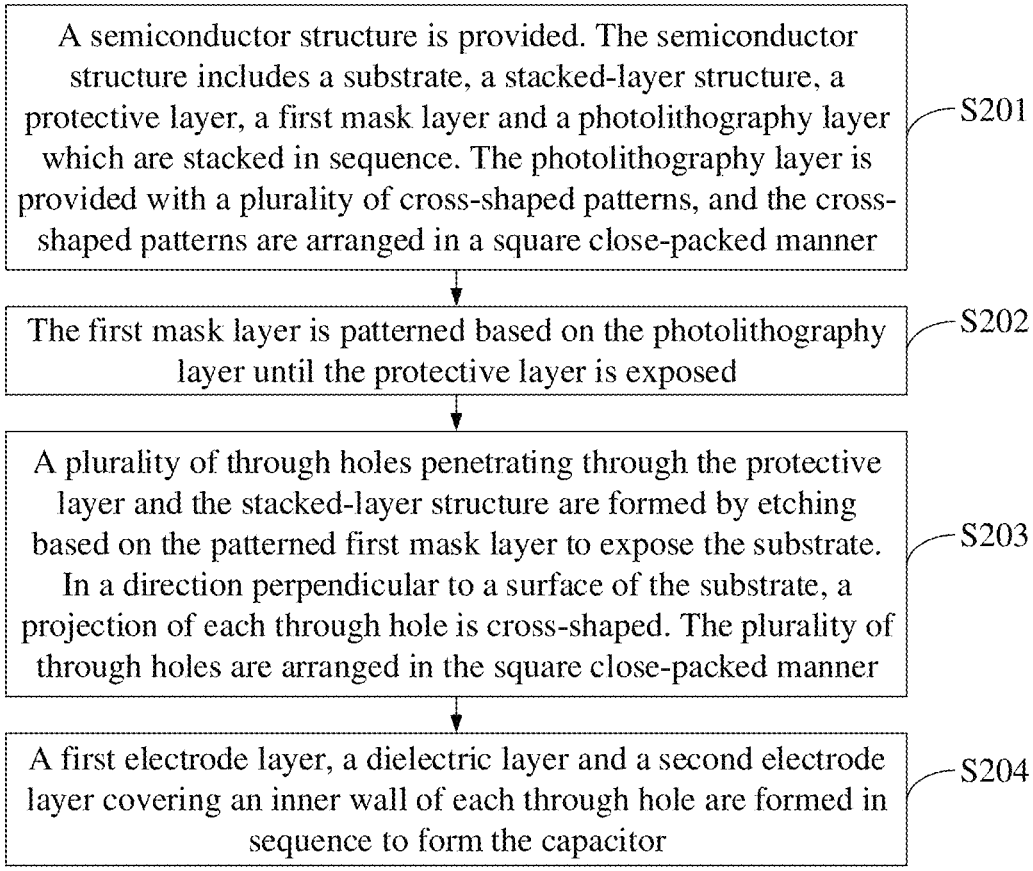
FIG. 2 is a flowchart of a method for forming a capacitor provided by an embodiment of the disclosure.

The embodiment of the disclosure provides the method for forming a capacitor. FIG. 2 is a flowchart of the method for forming a capacitor provided by the embodiment of the disclosure. As shown in FIG. 2, the capacitor can be formed by the operations of S201, S202, S203 and S204.

At S201, a semiconductor structure is provided. The semiconductor structure includes a substrate, a stacked-layer structure, a protective layer, a first mask layer and a photolithography layer which are stacked in sequence. The photolithography layer is provided with a plurality of cross-shaped patterns, and the cross-shaped patterns are arranged in a square close-packed manner.

At S202, the first mask layer is patterned based on the photolithography layer until the protective layer is exposed.

At S203, based on the patterned first mask layer, a plurality of through holes penetrating through the protective layer and the stacked-layer structure are formed by etching to expose the substrate. In a direction perpendicular to a surface of the substrate, a projection of each through hole is cross-shaped, and the plurality of through holes are arranged in the square close-packed manner.

At S204, a first electrode layer, a dielectric layer and a second electrode layer covering an inner wall of each through hole are formed in sequence to form the capacitor.

Figure 3A:
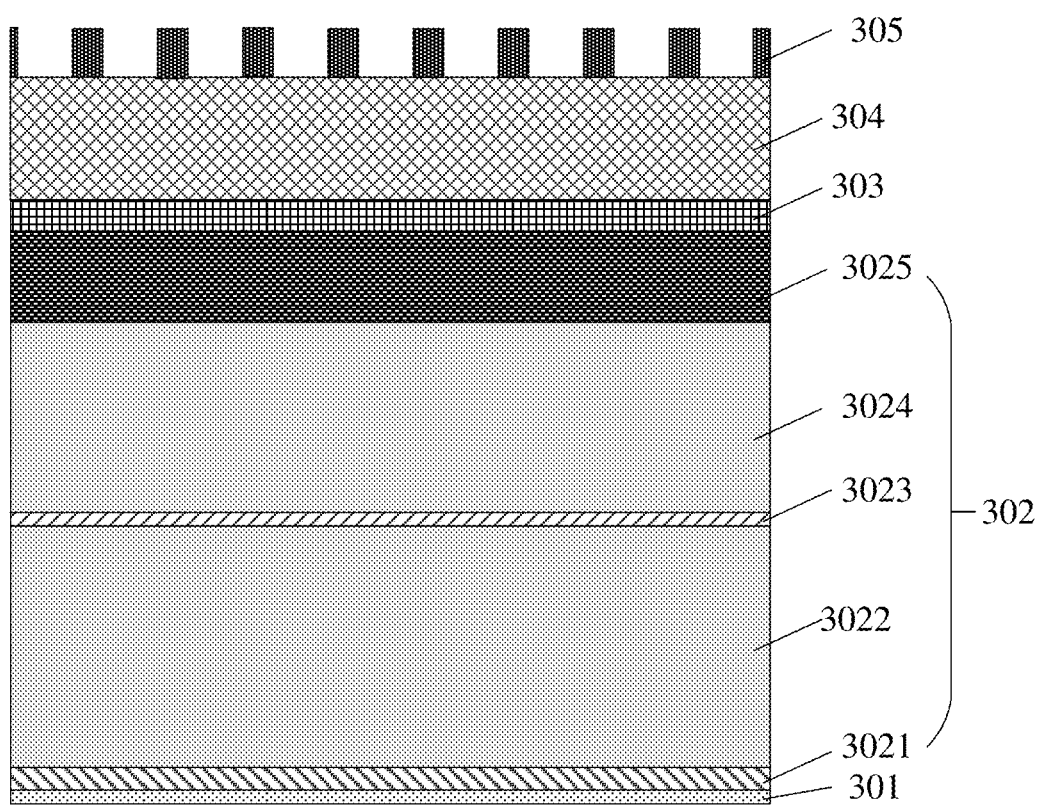
FIGS. 3A to 3N are partial structural schematic diagrams according to methods for forming a capacitor provided by an embodiment of the disclosure.
Figure 3B:
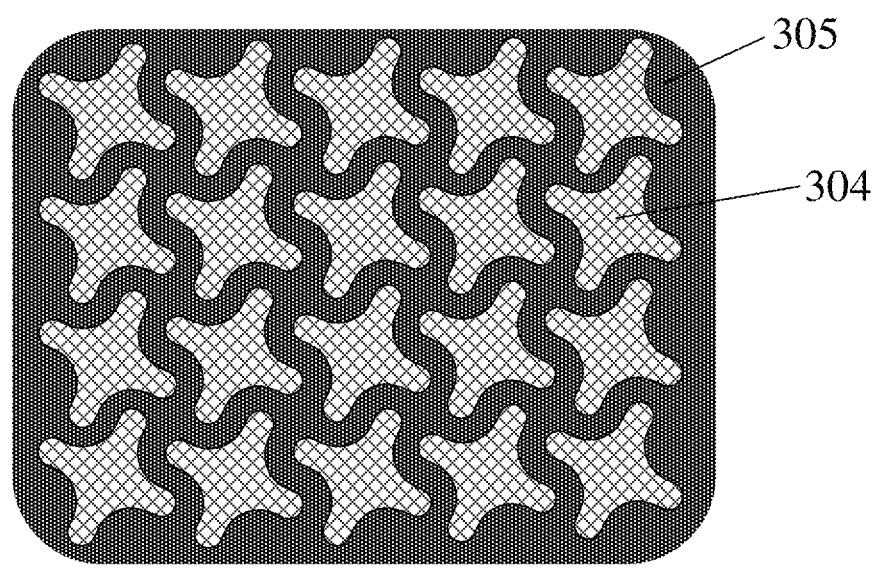
Figure 3C:
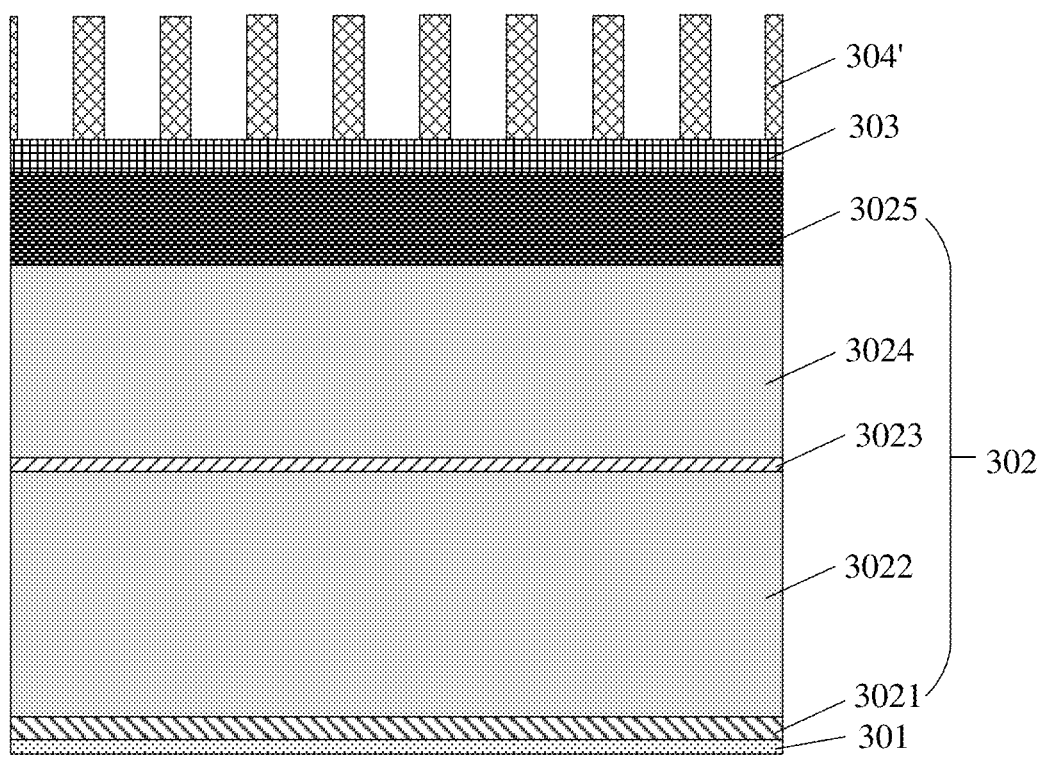
Figure 3D:
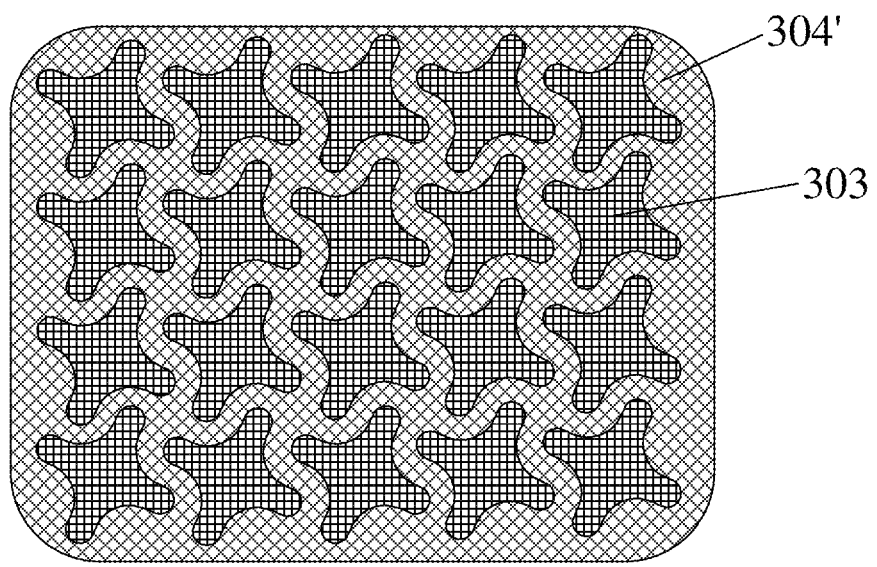
Figure 3E:
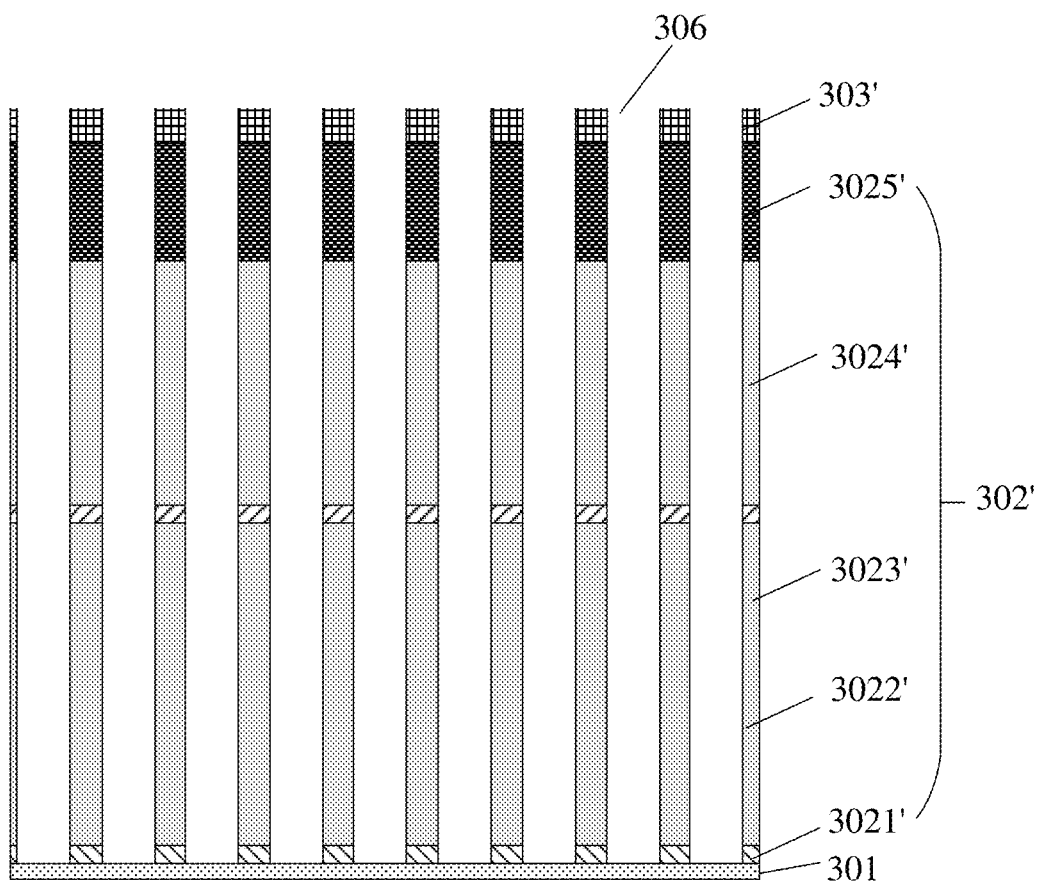
Figure 3F:
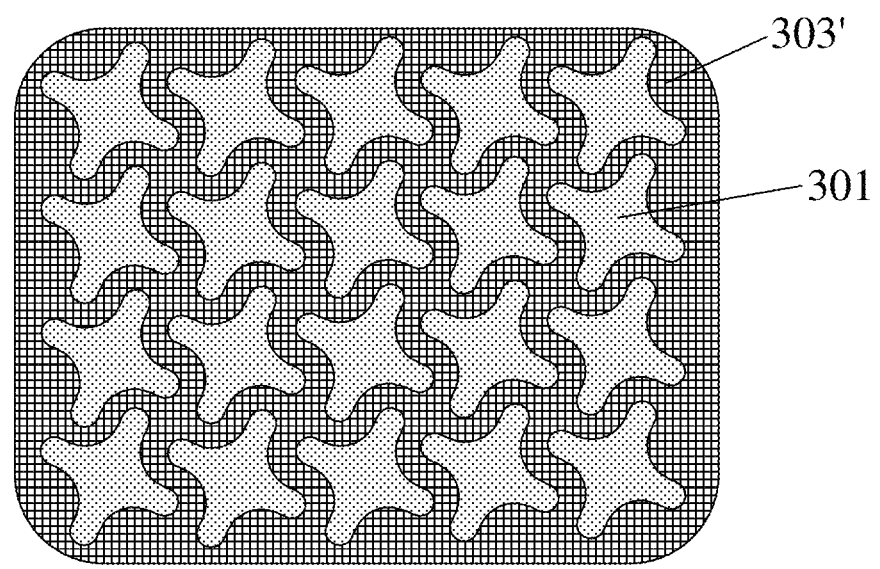
Figure 3G:
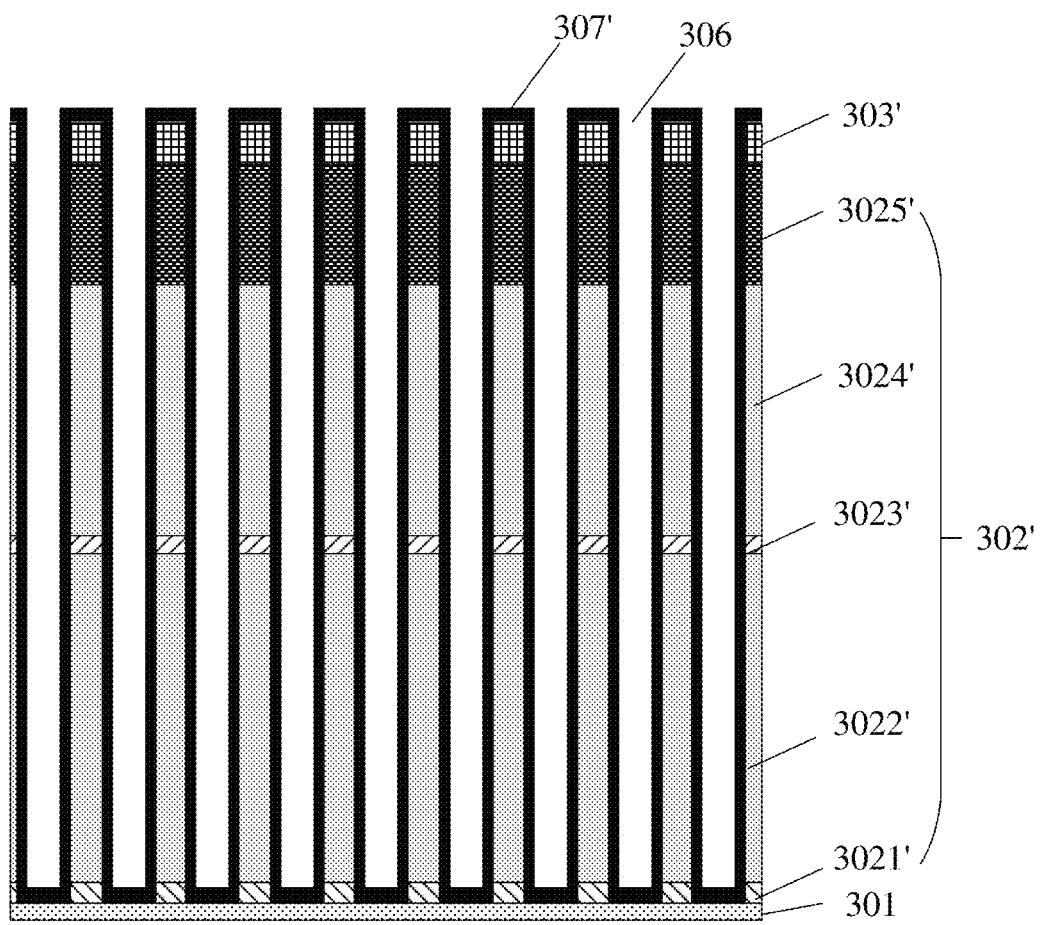
Figure 3H:
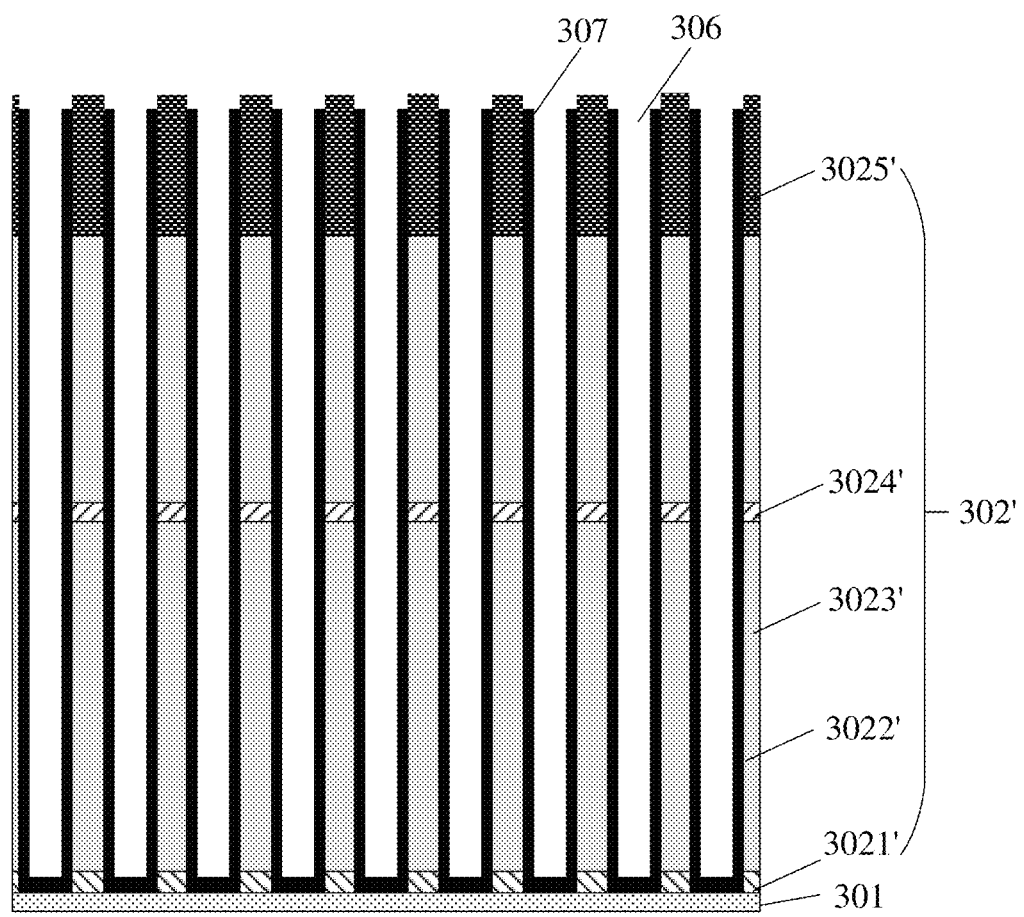
Figure 3I:
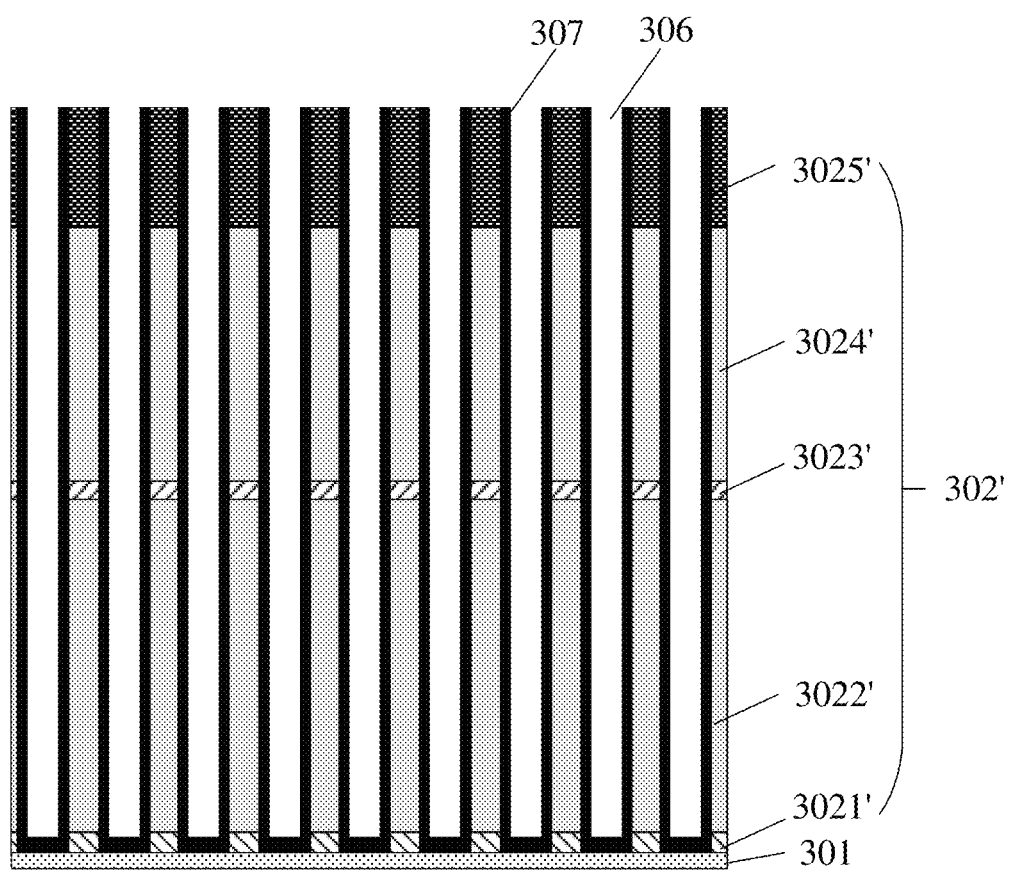
Figure 3J:
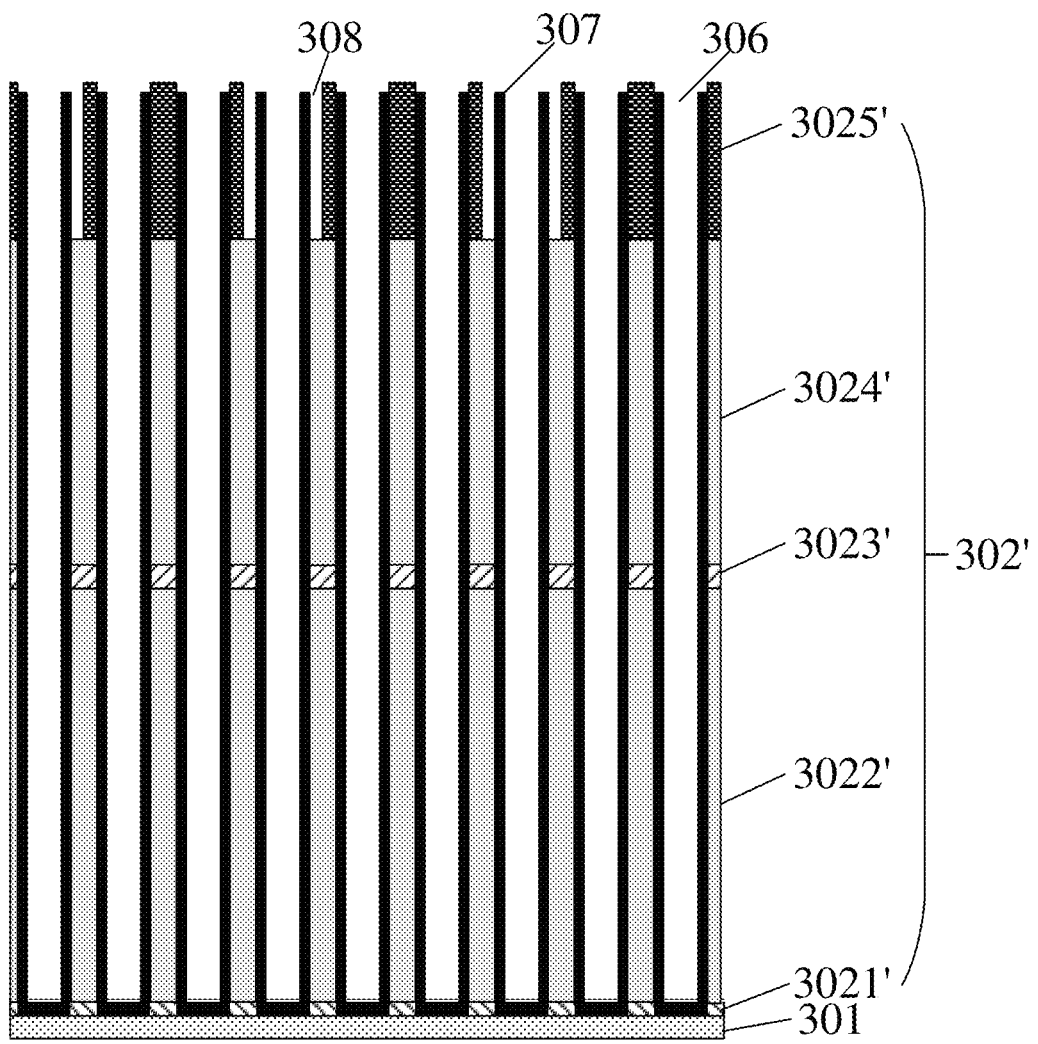
Figure 3K:
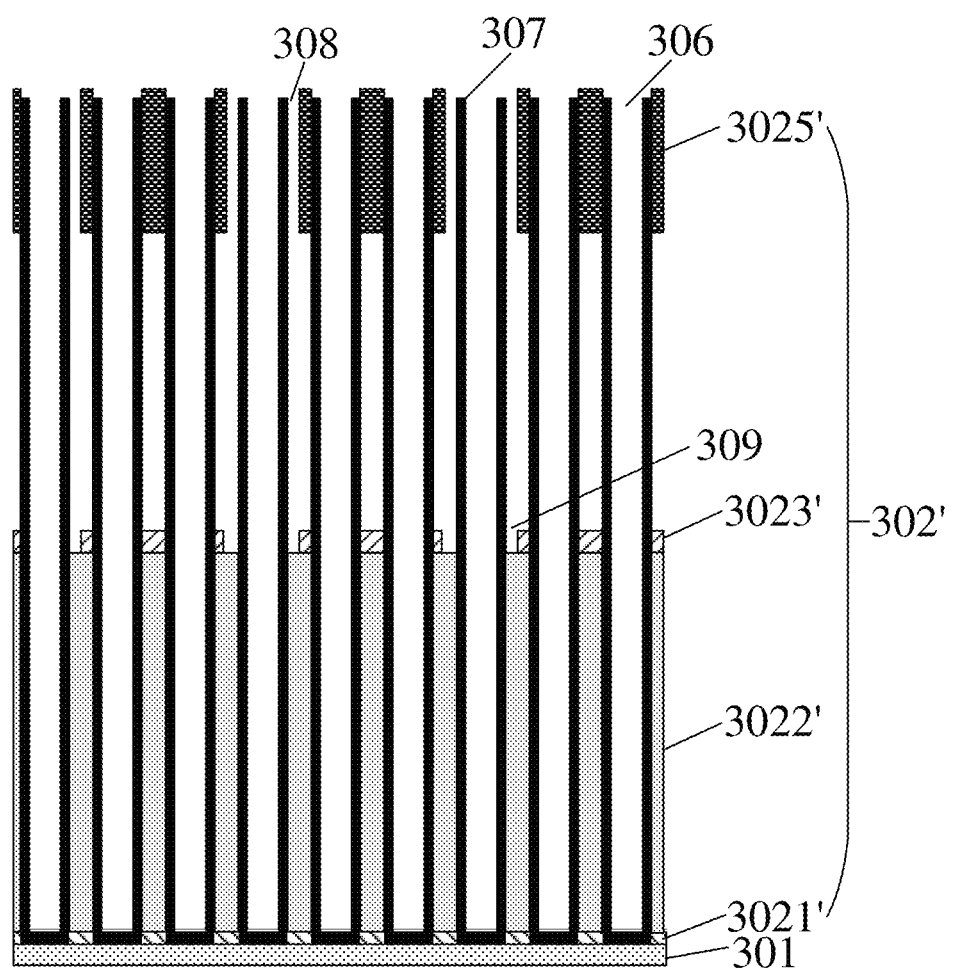
Figure 3L:
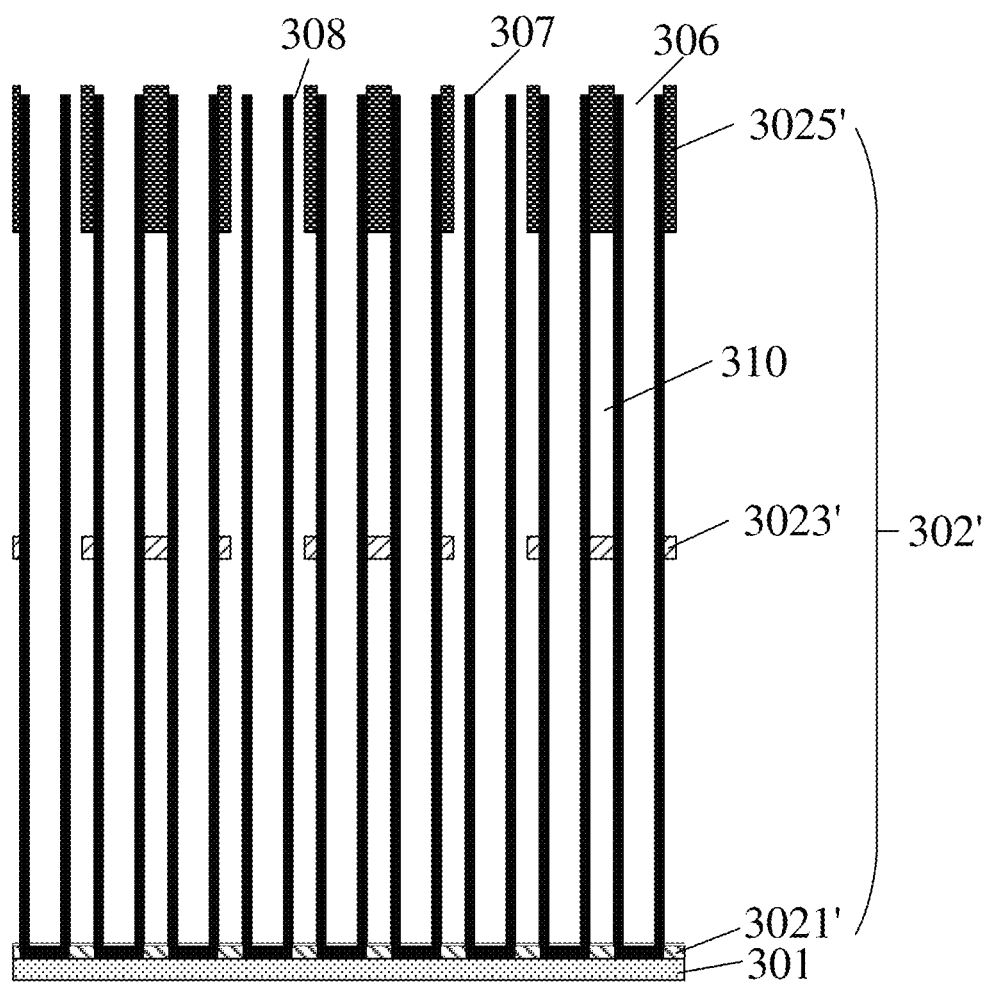
Figure 3M:
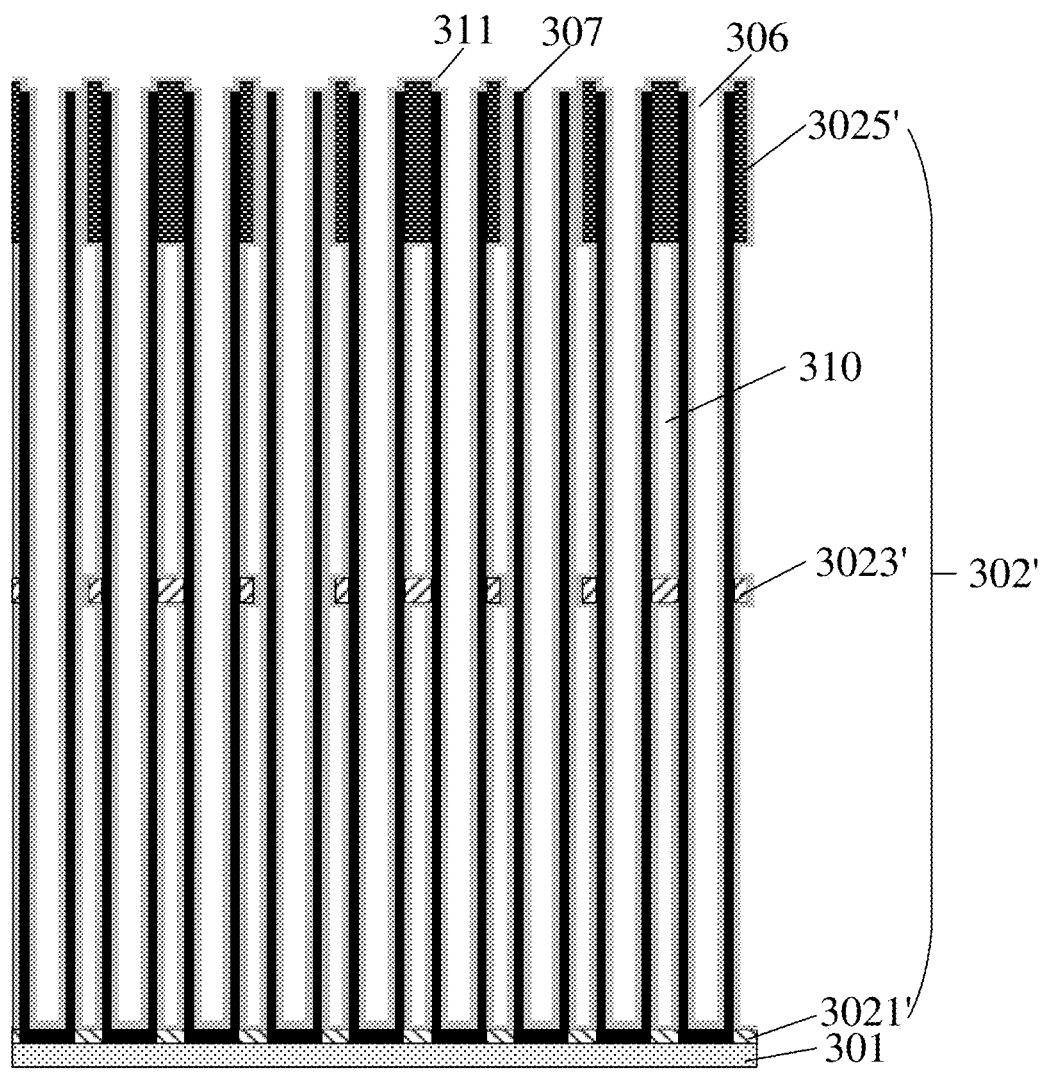
Figure 3N:
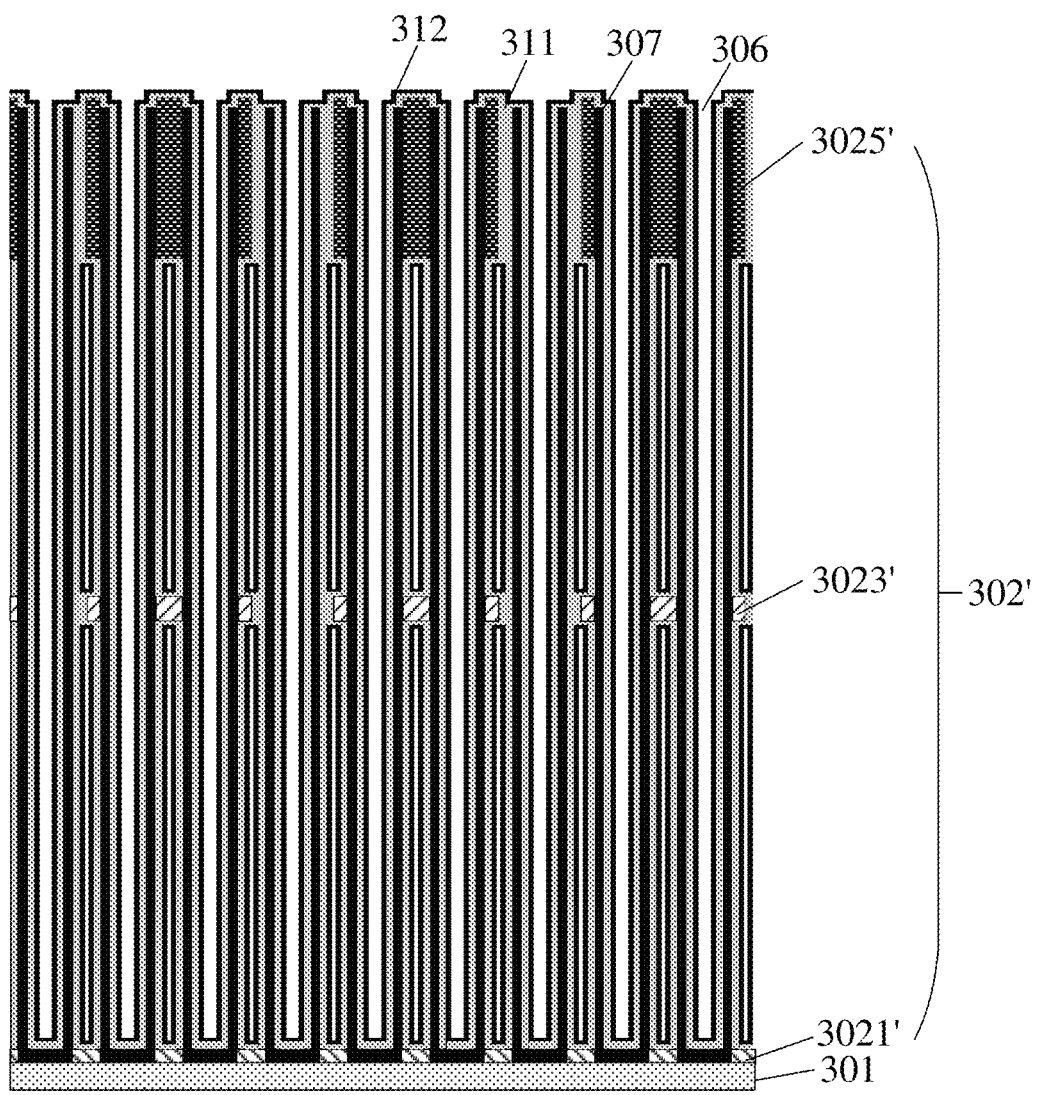

Referring to FIGS. 3A to 3N, the method for forming a capacitor provided by the embodiment of the disclosure is described in detail below.

As shown in FIG. 3A, S201 is performed to provide the semiconductor structure, which includes the substrate 301, the stacked-layer structure 302, the protective layer 303, the first mask layer 304, and a photolithography layer 305 which are stacked in sequence.

In some embodiments, the semiconductor structure may be formed by operations of S2011, S2012, S2013 and S2014.

At S2011, the substrate is provided.

In some embodiments, the substrate 301 of the semiconductor structure may be made of a semiconductor material, for example, one or more of silicon, germanium, a silicon-germanium compound or a silicon-carbon compound.

At S2012, on the surface of the substrate, a first supporting layer, a first sacrificial layer, a second supporting layer, a second sacrificial layer and a third supporting layer covering the substrate are deposited in sequence to form the stacked-layer structure.

In the embodiment of the disclosure, the stacked-layer structure 302 covering the substrate 301 may be formed by a physical vapor deposition (PVD) process, a chemical vapor deposition (CVD) process or an atomic layer deposition process. The stacked-layer structure 302 may include the first supporting layer 3021, the first sacrificial layer 3022, the second supporting layer 3023, the second sacrificial layer 3024 and the third supporting layer 3025 which cover the substrate 301 in sequence.

Here, in order to facilitate the etching of the stacked-layer structure 302, the first sacrificial layer 3022 and the second sacrificial layer 3024 may be made of a phosphoro silicate glass (PSG), a boro-phospho-silicate glass (BPSG) or a fluoro silicate glass (FSG) and other soft materials. The first supporting layer 3021, the second supporting layer 3023 and the third supporting layer 3025 may be made of a nitride, for example, silicon nitride, silicon carbonitride, silicon oxynitride or silicon boron nitride, etc.

At S2013, the protective layer and the first mask layer are deposited on a surface of the stacked-layer structure in sequence.

In some embodiments, the protective layer 303 and the first mask layer 304 are deposited on the surface of the stacked-layer structure 302 in sequence. Here, the protective layer 303 protects the third supporting layer 3025 of the stacked-layer structure 302 from damaging during the subsequent etching processes. The material of the protective layer 303 may be an oxide, for example, silicon oxide, etc. It should be noted that the thickness of the protective layer 303 may be between 50 nm and 100 nm.

At S2014, the photolithography layer covering the first mask layer is formed.

In some embodiments, the photolithography layer 305 covering the first mask layer 304 is formed by depositing. The photolithography layer 305 has the plurality of cross-shaped patterns, and the cross-shaped patterns are arranged in the square close-packed manner, as shown in FIG. 3B, which is a top view of the semiconductor structure provided by the embodiment of the disclosure.

Next, referring to FIG. 3C and FIG. 3D, S202 is performed to pattern the first mask layer 304 based on the photolithography layer 305 until the protective layer 303 is exposed, to obtain the patterned first mask layer 304'.

In some embodiments, the first mask layer 304 may be patterned by a dry etching process or a wet etching process. When the dry etching process is adopted, an etching gas may be any one of hydrobromic acid (HBr), nitrogen trifluoride (NF$_3$) or trifluoromethane (CHF$_3$), and an etching temperature of the dry etching process may be set between 30° C. and 90° C. The etching accuracy of the first mask layer is improved by defining the etching gas and the etching temperature of the dry etching process in the embodiment of the disclosure.

In some embodiments, the patterned first mask layer 304' has the same pattern as the photolithography layer 305, as shown in FIG. 3D.

In the embodiment of the disclosure, while the first mask layer 304 is patterned, the photolithography layer 305 is removed.

Next, referring to FIG. 3E and FIG. 3F, S203 is performed to form the plurality of through holes 306 penetrating through the protective layer 303 and the stacked-layer structure 302 by etching based on the patterned first mask layer 304', so as to obtain the etched protective layer 303' and the etched stacked-layer structure 302', exposing the substrate 301. Here, the etched stacked-layer structure 302' includes the etched first supporting layer 3021', the etched first sacrificial layer 3022', the etched second supporting layer 3023', the etched second sacrificial layer 3024' and the etched third supporting layer 3025'.

In some embodiments, the protective layer 303 and the stacked-layer structure 302 may be etched by the dry etching process or the wet etching process to form the through holes 306. The patterned first mask layer 304' is removed while the through holes 306 are formed.

FIG. 3F is a top view of the semiconductor structure formed with the through holes, which is provided by the embodiment of the disclosure. As shown in FIG. 3F, the substrate 301 are exposed by the through holes 306, and the structure of each through hole 306 is cross-shaped. The plurality of through holes 306 are arranged in the square close-packed manner, and the positions of every four adjacent through holes 306 may be connected to form a square.

Next, referring to FIGS. 3G and 3N, S204 is performed to form the first electrode layer, the dielectric layer and the second electrode layer in sequence covering the inner wall of each through hole.

In some embodiments, S204 may be performed by the operations of S2041, S2042, S2043, S2044, S2045 and S2046.

At S2041, an initial electrode layer covering the protective layer and the inner wall of each through hole is formed.

Referring to FIG. 3G, the initial electrode layer 307' may be formed on the inner wall of each through hole 306 and the surface of the etched protective layer 303' by the physical vapor deposition process, the chemical vapor deposition process or the atomic layer deposition process.

At S2042, the protective layer and the initial electrode layer covering the protective layer are removed to expose the third supporting layer. The initial electrode layer remained after the protective layer and the initial electrode layer covering the protective layer are removed constitutes the first electrode layer.

Referring to FIG. 3H, the etched protective layer 303' and part of the initial electrode layer 307' covering the surface of the etched protective layer 303' may be removed by the dry etching process or the wet etching process to form the first electrode layer 307.

In some embodiments, the material of the first electrode layer 307 may include a metal nitride and/or a metal silicide.

In some embodiments, when the part of the initial electrode layer 307' is etched, the upper surface of the first electrode layer 307 formed by etching may be lower than the upper surface of the remained third supporting layer (i.e., the etched third supporting layer 3025') of the stacked-layer structure 302 in the direction perpendicular to the surface of the substrate 301, as shown in FIG. 3H.

In some embodiments, when the part of the initial electrode layer 307' is etched, the upper surface of the first electrode layer 307 formed by etching and the upper surface of the etched third supporting layer 3025' of the stacked-layer structure 302 may be flush in the direction perpendicular to the surface of the substrate, as shown in FIG. 3I.

At S2043, part of the third supporting layer is etched in any direction parallel to the substrate to form a first opening, which exposes the second sacrificial layer.

Referring to FIG. 3J, the etched third supporting layer 3025' is partially etched in any direction parallel to the substrate to form the first opening 308 penetrating through the third supporting layer 3025'. The first opening 308 exposes the etched second sacrificial layer 3024'. In the embodiment of the disclosure, when the first opening is formed, one first opening 308 may be formed among every four adjacent through holes, or one first opening 308 may be formed between every two adjacent through holes, and the position of the first opening is not limited in the embodiment of the disclosure.

In some embodiments, the part of the third supporting layer 3025 may be removed by the dry etching process or the wet etching process.

At S2043, when a remained second sacrificial layer is removed with the first opening and the first electrode layer and the second supporting layer are exposed, part of the second supporting layer is etched in the any direction to form a second opening, which exposes the first sacrificial layer.

Referring to FIG. 3K, after the first opening 308 is formed, the remained second sacrificial layer (i.e., the etched second sacrificial layer 3024') may be removed by the dry etching process or the wet etching process, and the etched second supporting layer 3023' may be partially etched to form the second opening 309 penetrating through the etched second supporting layer 3023'.

In some embodiments, when the etched second sacrificial layer 3024' is removed by the wet etching process, a wet etching solution may be a mixed solution including diluted hydrofluoric acid (DHF) and ammonia ($NH_4OH$) or a mixed solution including diluted hydrofluoric acid (DHF) and tetramethylammonium hydroxide (TMAH).

In some embodiments, the projection position of the first opening 308 and the projection position of the second opening 309 may be the same or different in the direction perpendicular to the surface of the substrate 301.

At S2044, a remained first sacrificial layer is removed with the second opening, to expose the first supporting layer and form an interspace.

Referring to FIG. 3L, the remained first sacrificial layer (i.e., the etched first sacrificial layer 3022') may be removed by the dry etching process or the wet etching process to form the interspace 310. The interspace 310 exposes the etched first supporting layer 3021', the etched second supporting layer 3023', the etched third supporting layer 3025' and part of the outer wall of the first electrode layer 307.

In some embodiments, the interspace 310 penetrates through the whole etched stacked-layer structure 302', so the second opening 309 is located in the interspace 310.

At S2045, while the dielectric layer covering the first electrode layer is formed in sequence along the radial direction of the first electrode layer, the dielectric layers are formed in the interspace. The dielectric layer covers the first electrode layer, a remained first supporting layer, a remained second supporting layer and a remained third supporting layer.

Referring to FIG. 3M, the dielectric layer 311 may be formed by the physical vapor deposition process, the chemical vapor deposition process or the atomic layer deposition process. The dielectric layer 311 covers the first electrode layer 307, the etched first supporting layer 3021', the etched second supporting layer 3023' and the etched third supporting layer 3025'.

In some embodiments, the material of the dielectric layer 311 includes at least one of zirconia, hafnium oxide, titanium zirconium oxide, ruthenium oxide, antimony oxide or aluminum oxide.

At S2046, forming the second electrode layer covering the dielectric layer.

Referring to FIG. 3N, the second electrode layer 312 covering the dielectric layer 311 is formed by a deposition process to form the capacitor.

In some embodiments, the material of the second electrode layer 312 includes at least one of the metal nitride or the metal silicide.

According to the embodiment of the disclosure, the first mask layer is patterned by the photolithography layer with the plurality of cross-shaped patterns. Based on the patterned first mask layer, the plurality of cross-shaped through holes are formed by etching to expose the substrate. The through holes penetrate through the protective layer and the stacked-layer structure and are arranged in the square close-packed manner. The first electrode layer, the dielectric layer and the second electrode layer covering the inner wall of each cross-shaped through hole are formed in sequence to form the capacitor. In the method for forming the capacitor provided by the embodiment of the disclosure, electrode layers, each of which has a cross-shaped structure, arranged in the square close-packed manner are formed. As such, the utilization rate of the capacitor is increased, while the capacitor area and capacitance of a capacitor are increased, so that the capacitance density of the capacitor is higher and the properties of the capacitor are improved.

Figure 4:
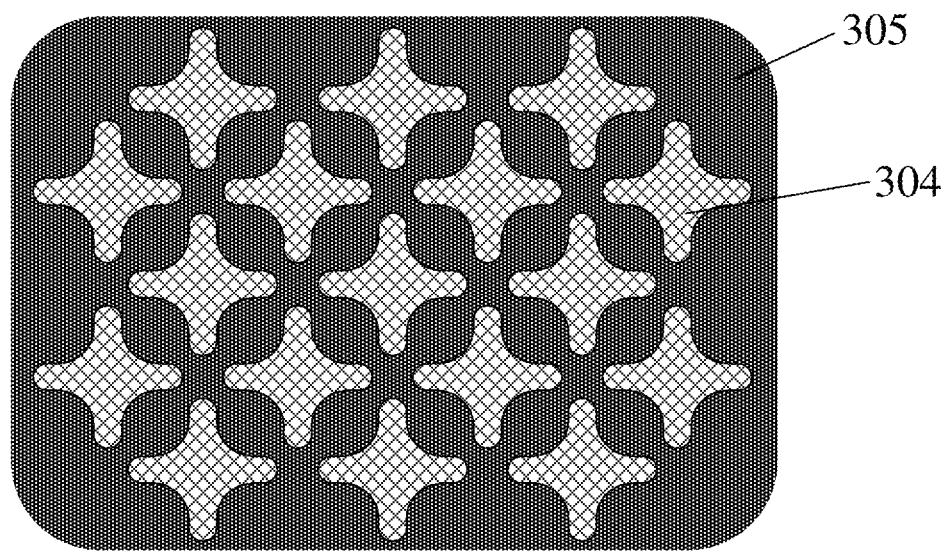
FIG. 4 is a partial top view of a semiconductor structure provided by an embodiment of the disclosure.

In some embodiments, at S2014, the plurality of cross-shaped patterns of the photolithography layer 305 may be arranged in a hexagonal close-packed manner, as shown in FIG. 4. FIG. 4 is a partial top view of the semiconductor structure provided by the embodiment of the disclosure, in which the positions of every four adjacent cross-shaped patterns of the photolithography layer 305, if being connected, are capable of forming a rhombus.

In some embodiments, the first mask layer 304 may include a polysilicon layer 3041, an oxide layer 3042 and a first hard mask layer 3043 stacked in sequence. Next, referring to FIGS. 5A and 5B, S202 may be realized by S2021 and S2022.

At S2021, the first hard mask layer is patterned based on the photolithography layer to form a patterned first hard mask layer.

At S2022, based on the patterned first hard mask layer, the oxide layer and the polysilicon layer are etched in sequence to complete patterning of the polysilicon layer, the oxide layer and the first hard mask layer and form the patterned first mask layer.

Figure 5A:
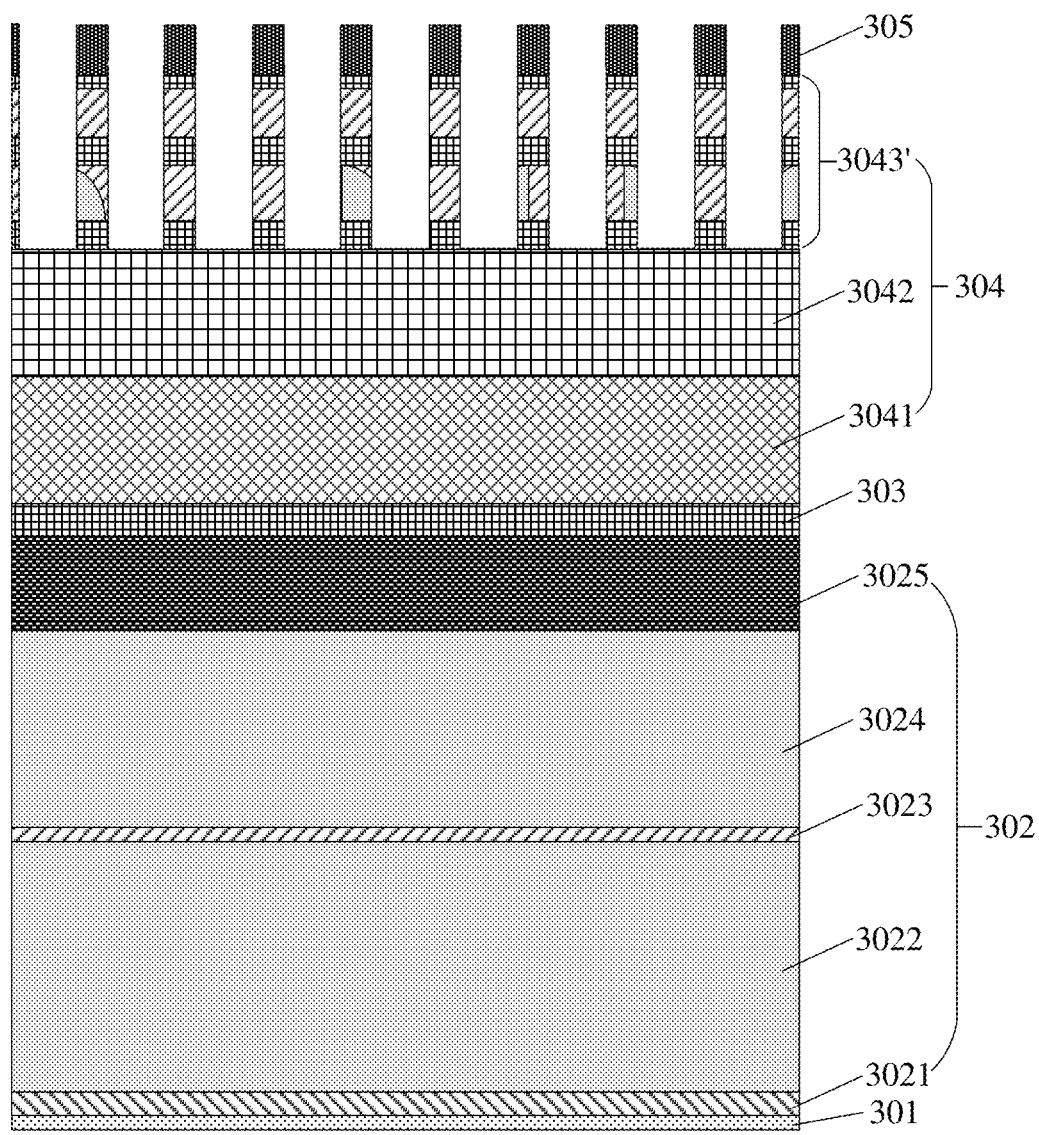
FIGS. 5A and 5B are partial structural schematic diagrams according to a method for forming a capacitor provided by an embodiment of the disclosure.
Figure 5B:
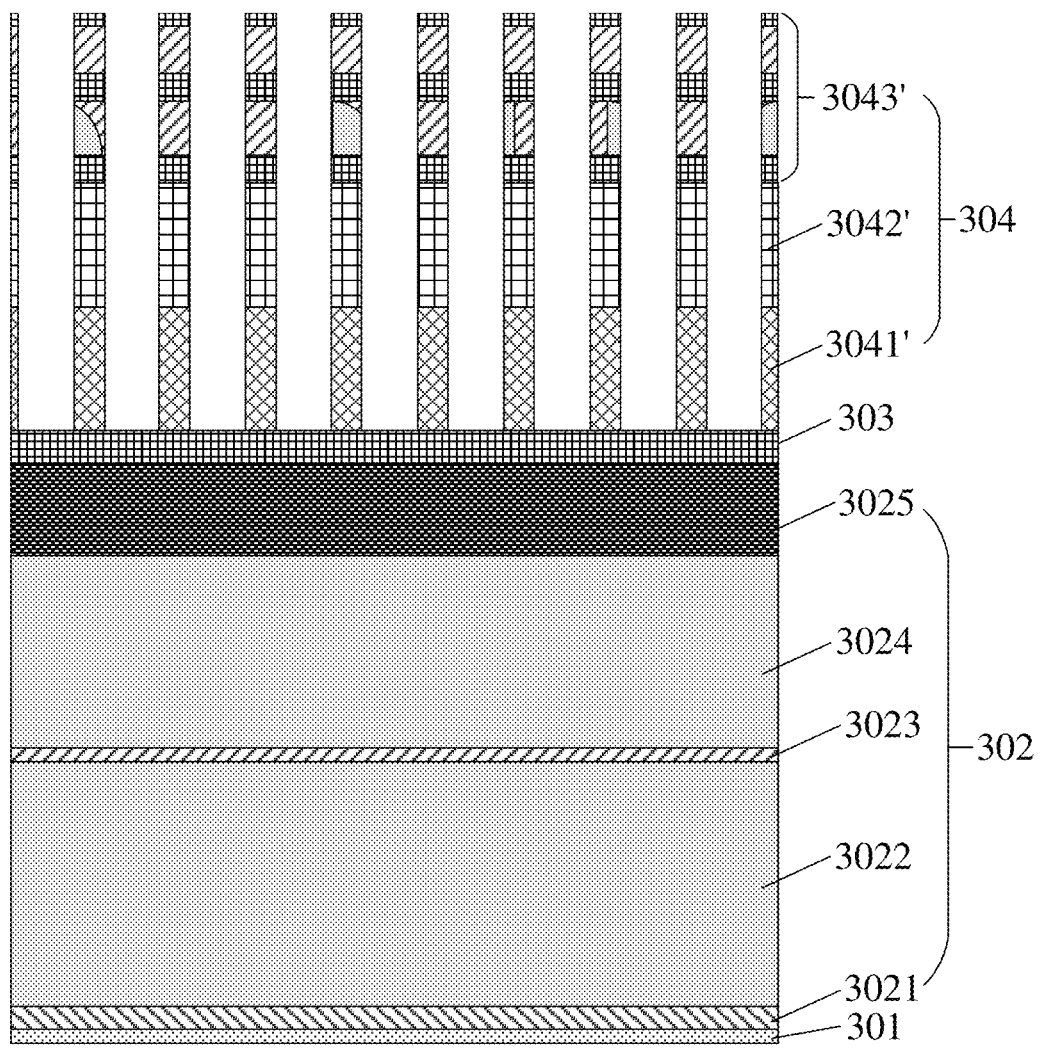

As shown in FIGS. 5A and 5B, the first hard mask layer 3043 is patterned with the photolithography layer 305 to form the patterned first hard mask layer 3043'. Here, the first hard mask layer 3043 may have a single-layer structure or a stacked-layer structure. The first hard mask layer 3043 provided by the embodiment of the disclosure has the stacked-layer structure. Here, the material of the first hard mask layer 3043 may be any one of free silicon carbide, a Bottom Anti-Reflection Coating (BARC) or a Spin-on Carbon (SOC) material.

After the first hard mask layer 3043 is patterned, the photolithography layer 305 is removed. Based on the patterned first hard mask layer 3043', the oxide layer 3042 and the polysilicon layer 3041 are etched in sequence to form an etched oxide layer 3042' and an etched polysilicon layer 3041', respectively.

Figure 6:
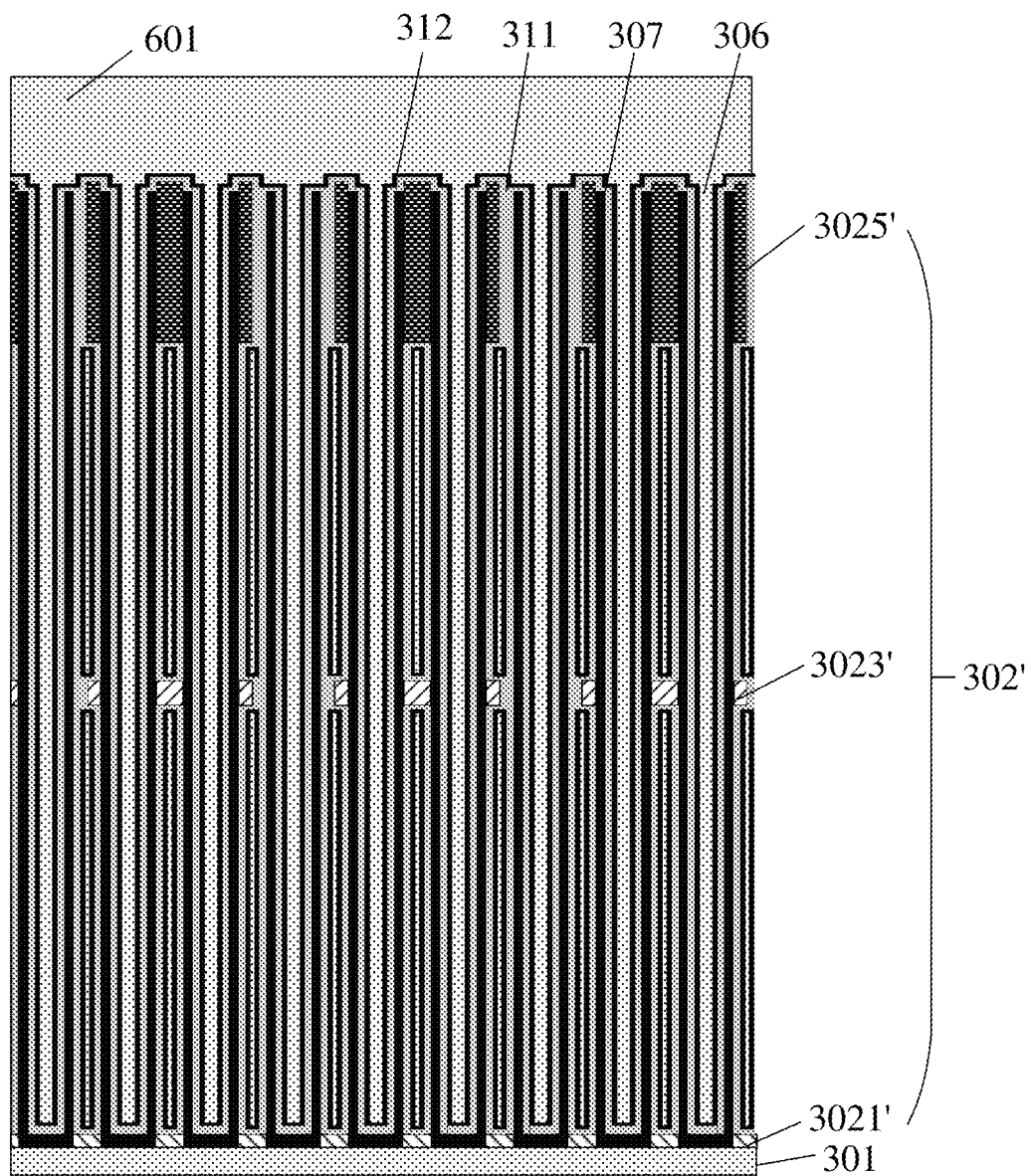
FIG. 6 is a partial structural schematic diagram of a capacitor provided by an embodiment of the disclosure.

In some embodiments, after S204, a semiconductor material may be filled in gaps between second electrode layers 312 and surfaces of the second electrode layers 312 to form a filling structure 601, so as to support the capacitor with the filling structure 601, as shown in FIG. 6, which is a partial structural schematic diagram of the capacitor provided by the embodiment of the disclosure. Here, the filling structure may be formed by the physical vapor deposition process, the chemical vapor deposition process or the atomic layer deposition process, and the filling structure may be made of silicon germanium, lanthanum oxide or other materials.

Figure 7:
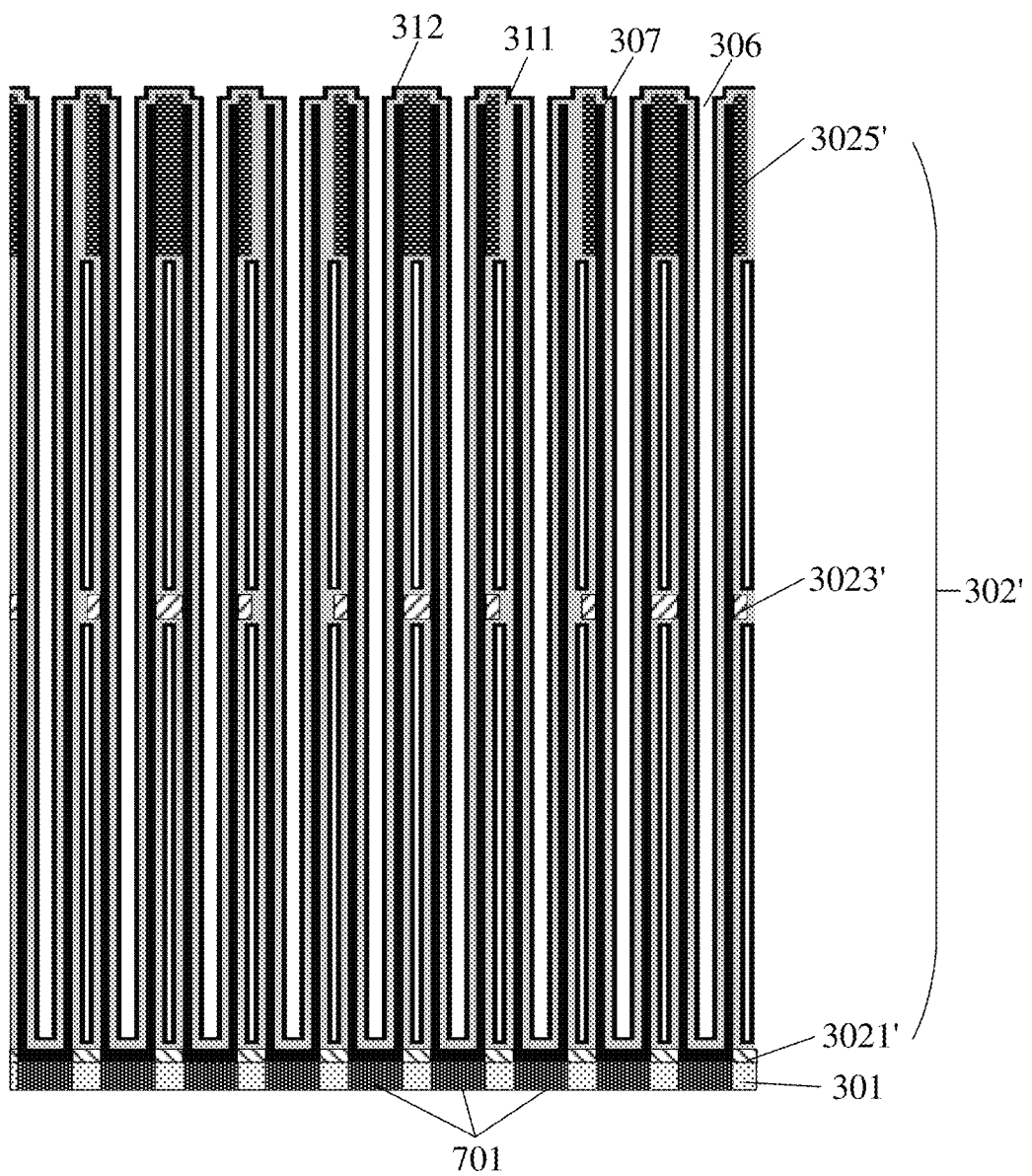
FIG. 7 is a partial structural schematic diagram of a capacitor with contact pads provided by an embodiment of the disclosure.

In some embodiments, the substrate 301 is provided with a plurality of contact pads 701. After the first electrode layer 307 is formed, the first electrode layer 307 is connected to a contact pad 701. As shown in FIG. 7, the contact pad 701 is used to connect the capacitor to the source or drain of a transistor in the substrate.

The capacitor provided by the embodiment of the disclosure increases the capacitor area and the capacitance of a capacitor with the electrode layers, each of which has the cross-shaped structure, and the capacitance density of the capacitor is increased with a specific electrode layer close-packed manner. Moreover, the support property and stability of the capacitor are improved with the filling structure, and the properties of the capacitor are improved.

In several embodiments provided by the disclosure, it should be understood that the disclosed devices and methods may be implemented in a non-target way. The above-described device embodiments are only illustrative. For example, the division of the units is only a logical function division, and there may be other division modes in actual implementation, such as, multiple units or components may be combined or integrated into another system, or some features may be ignored or not executed. In addition, the components shown or discussed are coupled, or directly coupled to each other.

The units described above as separate components may or may not be physically separate, and components shown as units may or may not be physical units, that is, they may be located in one place or distributed to multiple network units. Some or all of the units may be selected according to actual requirements to achieve the purpose of the solution of the embodiment of the disclosure.

The features disclosed in several method or device embodiments provided by the disclosure may be arbitrarily combined without conflict to obtain a new method embodiment or device embodiment.

The above are only some embodiments of the disclosure, but the scope of protection of the disclosure is not limited to this. Changes or replacements can be easily thought of by any person skilled in the art and such changes or replacements should be covered by the scope of protection of the disclosure. Therefore, the scope of protection of the disclosure should be subject to the scope of protection of the claims.

The invention claimed is:

1. A method for forming a capacitor, comprising:
providing a semiconductor structure, wherein the semiconductor structure comprises a substrate, a stacked-layer structure, a protective layer, a first mask layer and a photolithography layer which are stacked in sequence, wherein the photolithography layer is provided with a plurality of cross-shaped patterns, and the plurality of cross-shaped patterns are arranged in a square close-packed manner;
patterning the first mask layer based on the photolithography layer until the protective layer is exposed to form a patterned first mask layer;
forming a plurality of through holes penetrating through the protective layer and the stacked-layer structure by etching based on the patterned first mask layer to expose the substrate, wherein in a direction perpendicular to a surface of the substrate, a projection of each of the plurality of through holes is cross-shaped, and the plurality of through holes are arranged in the square close-packed manner; and
forming a first electrode layer, a dielectric layer and a second electrode layer covering an inner wall of each of the plurality of through holes in sequence to form the capacitor.

2. The method according to claim 1, wherein positions of every four adjacent cross-shaped patterns of the plurality of cross-shaped patterns of the photolithography layer, if being connected, are capable of forming a square.

3. The method according to claim 1, wherein the plurality of cross-shaped patterns of the photolithography layer are arranged in a hexagonal close-packed manner.

4. The method according to claim 1, wherein the first mask layer comprises a polysilicon layer, an oxide layer and a first hard mask layer stacked in sequence, and the patterning the first mask layer based on the photolithography layer comprises:
patterning the first hard mask layer based on the photolithography layer to form a patterned first hard mask layer; and
based on the patterned first hard mask layer, etching the oxide layer and the polysilicon layer in sequence, to complete patterning of the polysilicon layer, the oxide layer and the first hard mask layer and form the patterned first mask layer.

5. The method according to claim 1, wherein the semiconductor structure is formed by:
providing the substrate;
on the surface of the substrate, forming a first supporting layer, a first sacrificial layer, a second supporting layer, a second sacrificial layer and a third supporting layer covering the substrate by depositing in sequence to form the stacked-layer structure;
forming the protective layer and the first mask layer on a surface of the stacked-layer structure by depositing in sequence; and
forming the photolithography layer covering the first mask layer.

6. The method according to claim 5, wherein the forming the first electrode layer, the dielectric layer and the second electrode layer covering the inner wall of each of the plurality of through holes in sequence comprises:
forming an initial electrode layer covering the protective layer and the inner wall of each of the plurality of through holes;
removing the protective layer and the initial electrode layer covering the protective layer to expose the third supporting layer, wherein the initial electrode layer remaining after removing the protective layer and the initial electrode layer covering the protective layer constitutes the first electrode layer; and forming the dielectric layer and the second electrode layer covering the first electrode layer in sequence along a radial direction of the first electrode layer.

7. The method according to claim 6, wherein the method further comprises: after forming the first electrode layer, etching part of the third supporting layer in any direction parallel to the substrate to form a first opening, which exposes the second sacrificial layer;

removing a remaining portion of the second sacrificial layer and exposing the first electrode layer and the second supporting layer with the first opening, while etching part of the second supporting layer in the any direction to form a second opening, which exposes the first sacrificial layer; and removing a remaining portion of the first sacrificial layer with the second opening, to expose the first supporting layer and form an interspace.

8. The method according to claim 7, wherein the forming the dielectric layer and the second electrode layer covering the first electrode layer in sequence along the radial direction of the first electrode layer comprises:

along the radial direction of the first electrode layer, forming the dielectric layer in the interspace while forming the dielectric layer covering the first electrode layer in sequence, wherein the dielectric layer covers the first electrode layer, a remaining portion of the first supporting layer, a remaining portion of the second supporting layer and a remaining portion of the third supporting layer; and forming the second electrode layer covering the dielectric layer.

9. The method according to claim 1, wherein the second electrode layer has a plurality of gaps; and the method further comprises: after forming the second electrode layer, filling a semiconductor material in each of the plurality of gaps of the second electrode layer to form a filling structure to support the capacitor with the filling structure.

10. The method according to claim 1, wherein the substrate has a plurality of contact pads; and wherein the first electrode layer is connected to a contact pad of the plurality of contact pads after the first electrode layer is formed.

11. A capacitor, comprising:

a substrate;

a first supporting layer, a second supporting layer and a third supporting layer arranged on the substrate, wherein the second supporting layer is located between the first supporting layer and the third supporting layer;

a first electrode layer of a plurality of first electrode layers arranged perpendicular to the substrate and penetrating through the first supporting layer, the second supporting layer and the third supporting layer, wherein in a direction perpendicular to a surface of the substrate, a projection of the first electrode layer is cross-shaped, and the plurality of first electrode layers are arranged in a square close-packed manner; dielectric layers covering a surface of each of the plurality of first electrode layers; and a second electrode layer covering a surface of each of the dielectric layers.

12. The capacitor according to claim 11, wherein the plurality of first electrode layers are arranged in a hexagonal close-packed manner.

13. The capacitor according to claim 11, wherein a plurality of contact pads are arranged in the substrate, and each of the plurality of contact pads is connected to one of the plurality of first electrode layers.

14. The capacitor according to claim 11, wherein the capacitor further comprises a filling structure filled in a gap of the second electrode layer, wherein the filling structure is used for supporting the capacitor.

15. The capacitor according to claim 11, wherein materials of the first supporting layer, the second supporting layer and the third supporting layer respectively comprise at least one of silicon oxide, silicon nitride, silicon carbon nitride or silicon oxynitride.

16. The capacitor according to claim 11, wherein:

a material of each of the plurality of first electrode layers comprises at least one of a metal nitride or a metal silicide;

a material of the second electrode layer comprises at least one of the metal nitride or the metal silicide; and a material of each of the dielectric layers comprises at least one of zirconia, hafnium oxide, titanium zirconium oxide, ruthenium oxide, antimony oxide or aluminum oxide.

* * * * *